United States Patent [19]

Bayer

[11] Patent Number: 5,684,399

[45] Date of Patent: Nov. 4, 1997

[54] DETECTION OF MAGNETIZED FLUID FLOWS

[75] Inventor: Alwin Bayer, Greding, Germany

[73] Assignee: The Petroleum Science and Technology Institute, Edinburgh, Scotland

[21] Appl. No.: 499,668

[22] Filed: Jul. 6, 1995

[30] Foreign Application Priority Data

Jul. 6, 1994 [GB] United Kingdom ............... 9413629

[51] Int. Cl.$^6$ .............................................. G01V 3/00
[52] U.S. Cl. .................................. 324/306; 324/300
[58] Field of Search ......................... 324/300, 306, 324/307, 309, 312, 314

[56] References Cited

U.S. PATENT DOCUMENTS

| | | | |
|---|---|---|---|
| 3,419,793 | 12/1968 | Genthe et al. | 324/306 |
| 4,531,093 | 7/1985 | Rollwitz et al. | 324/306 |
| 4,638,251 | 1/1987 | King | 324/306 |
| 4,782,295 | 11/1988 | Lew | 324/306 |
| 5,530,350 | 6/1996 | Dechene et al. | 324/306 |

*Primary Examiner*—Louis M. Arana
*Attorney, Agent, or Firm*—Oblon, Spivak, McClelland, Maier & Neustadt, P.C.

[57] ABSTRACT

An apparatus and method for determining the individual mass flow rates of a multi-component flow. Individual components of the multi-component flow have different products of longitudinal relaxation time and flow velocity. Two or more arrangements of magnets and flow sensors are arranged along a pipeline. A static magnetic field is imposed on the flow. The linear movement of the flow then generates a multi-exponential gain of magnetization. By interrogating the flow at several positions, the magnetization and velocity is measured simultaneously in different positions. The multi-exponential gain of magnetization and determination of the equilibrium magnetization of each component thermal equilibrium can then be determined. The mass flow rates in the individual components can then be determined.

32 Claims, 5 Drawing Sheets

DETECTION OF MAGNETIZED FLUID FLOWS

The present invention relates to a method and apparatus using the longitudinal relaxation effect in NMR or EMR to distinguish between the different components of a multi-component flow.

The principles of nuclear magnetic resonance (NMR) or electron magnetic resonance (EMR) provide an excellent basis to construct and operate a flowmeter that is ideal for measuring the individual mass flow rates of a multi-component flow without mixture separation. Such applications of the NMR or EMR principles have not been practised at the present time.

The invention is concerned with a method and apparatus for the measurement of the individual mass flow rates of a multi-component flow. Multi-component flows occur in various areas of technology. Amongst them is, for example, the production of oil wells which can be a mixture of oil and water. In oil production it is important for fiscal and technical reasons to measure the individual mass flow rates of the well production. At the moment, this is done by separating the flow into its individual components and measuring the flow in its single phase state with conventional meters. Such a measurement method is technically elaborate. It is the object of this invention to do without separators and measure the individual mass flow rates of a multi-component flow in an unconditioned state. This may be particularly important when the well is underwater or in a location difficult to access.

Another object of the invention is to provide a non-invasive measurement of the multi-component flow. In practice, multi-component flows often contain small amounts of abrasive components. One example are minerals in the production of an oil well. To provide a suitable measurement method in such a situation, it is desirable to have a mechanically simple apparatus with no moving parts in the flow avoiding wear of the flowmeter. Towards this, magnetic resonance techniques (NMR and EMR) are utilized to sense the different components of the flow. NMR or EMR sensing techniques principally are very advantageous in providing such a measurement method since the sensor is a simple coil wound around a pipe giving no obstruction to the flow.

Another object of the invention is to provide a measurement of the multi-component flow based on the longitudinal relaxation effect of either nuclei or electrons. Subject to the longitudinal relaxation can be various elements. In NMR, the element of interest may be hydrogen. Carbon compounds may be especially rich in free electrons subject to EMR measurement.

Hydrogen nuclei, which are abundant in substances like crude oil or water, have a magnetic moment due to the spin of the protons. If such nuclei are brought into an external magnetic field they align themselves along the field direction resulting in a net magnetization of the hydrogen containing material. The process which allows that kind of magnetization is called the longitudinal relaxation. In literature, the same process is also called thermal or spin-lattice relaxation. The rate at which the nuclei align themselves in the magnetic field in NMR is described by the longitudinal relaxation time $T_1$. Unpaired electrons are also subject to the same relaxation process in EMR.

Significant in this invention is the fact that the longitudinal relaxation time $T_1$ is a specific constant and different for different materials. For example, the longitudinal relaxation time of hydrogen nuclei in oil is significantly shorter than the longitudinal relaxation time of hydrogen nuclei in water. This, as will be seen later, permits the distinction between the different components of a multi-component flow provided the individual components of the flow show different products of longitudinal relaxation times $T_1$ and corresponding velocity v.

To measure the individual mass flow rates of a multi-component flow the invention uses a combination of several magnets and NMR (or EMR) flow sensors aligned along a pipeline. In one embodiment of this apparatus, a group of polarizing and detection magnets is assembled giving an almost constant magnetic field $H_0$ over a sufficient length. In the magnetic field $H_0$ a pipe of non-magnetic material is placed.

If a multi component fluid, whose individual components have a magnetic moment, is exposed to the magnetic field $H_0$ of this magnet arrangement, a magnetization process starts. For explanation purposes, consider a fluid element of the flow entering the magnet arrangement. For reasons of simplicity, plug flow is assumed for this consideration. When entering the magnetic arrangement, the material of the fluid element experiences a sudden change of the external magnetic field from zero to $H_0$. While the fluid element is moving along the non-magnetic pipe-section, the enclosed material within the fluid element is being polarized, i.e. the nuclei or free electrons of the individual components of the flow align themselves along the field direction. The movement of the flow changes this gain of fluid magnetization in time into a gain of fluid magnetization along a geometric distance.

Consider the instance where the flow rate of a single component flow is constant. In such a case, the exponential gain of magnetization in time is changed into an exponential gain of magnetization along the pipeline due to the linear movement of the flow. If the flow, however, is a multi-component flow, there is a superposition of the magnetization processes of the individual components of the flow. For every point in the magnetic field $H_0$ of the magnet arrangement the total magnetization of the multi-component flow is the sum of the magnetization of its individual components. If the product of fluid velocity v and longitudinal relaxation time $T_1$ is different for each individual component this results in a multi-exponential gain of magnetization along the pipeline.

The existence of such a multi-exponential magnetization curve is very advantageous for measuring the mass flow rates of the individual components of the flow, since the curve contains information on the individual components of the flow. The exact shape of the multi-exponential magnetization curve is determined by the fluid velocity v (which is assumed to be equal for each component). the longitudinal relaxation times $T_1$ of the individual components, and the equilibrium magnetization $M_0$ of the individual components in thermal equilibrium. The value of the equilibrium magnetization $M_0$ of the individual components is determined by the number of spins each individual component contributes to the total number of spins in a given reference volume. In general, the reference volume is the volume excited by an initial RF-pulse.

Consider now the case where following of the parameter have been determined previously: the values of the longitudinal relaxation times $T_1$ of the individual components, and the flow velocity v with a suitable NMR (or EMR) sensing technique. In such a case, the exact shape of the multi-exponential magnetization curve for a multi-components flow with n components is determined by n values for the equilibrium magnetization $M_{01}, M_{02}, \ldots,$ $M_{On}$. If the gain of magnetization $M(s)$ along the pipeline is measured at least at n positions, a system of n equations for the measured local magnetization $M_1, M_2, \ldots, M_n$ of the flow with n unknown values for the equilibrium magnetizations $M_{O1}, M_{O2}, \ldots, M_{On}$ is yielded. A suitable mathematical algorithm allows the calculation of the equilibrium magnetizations $M_{O1}, M_{O2}, \ldots$ and $M_{On}$ of the individual components. The calculated values of $M_{O1}, M_{O2}, \ldots$ and $M_{On}$ are a quantitative measure of the mass of each individual component present in the flow. The products of velocity v and equilibrium magnetizations $M_{O1}, M_{O2}, \ldots, M_{On}$, hence, are proportional to the individual mass flow rates of the multi-component flow. They can be converted into mass flow rates by means of suitable calibration factors.

In essence, the method to evaluate the information of the multi-exponential magnetization curve is to measure fluid magnetization $M_1, M_2, \ldots, M_n$ and velocity v at several positions within the magnet arrangement. Fluid magnetization and fluid velocity are obtained by suitable pulse techniques.

In the preferred method, a pulse technique in combination with field gradients is used for measuring fluid magnetization M and fluid velocity v (U.S. Pat. No. 4,536,711). To supply an appropriate field gradient, special detection magnets having a linear gradient are suggested to be used. An initial burst of HF fed into the RF-coil winded around the non-magnetic pipe excites a volume of interest in the pipe flow. This excited volume is being refocussed by another suitable burst of HF after a time $\tau$, and a spin-echo after time $2\tau$ is obtained. Phase information and amplitude of this spin-echo are measured with the NMR or EMR detection apparatus. In a flow situation, the spins of the excited volume are changing their position in the field gradient during the time $2\tau$, and the emitted HF of the refocussed volume is shifted in its phase, since the magnetic environment of the spins is changed. If the gradient is linear, the phase shift is proportional to fluid velocity. In that way, information on fluid velocity is obtained. In addition to this, the peak of the FID following the initial excitation pulse is proportional to the magnetization M of the excited volume. Another way of measuring the magnetization M of the excited volume is to determine the amplitude of the NMR (or EMR) signal of the spin-echo.

In order to sample fluid magnetization and fluid velocity with said pulse method, at several positions in the flow, a special control unit triggers the NMR (or EMR) flow sensors aligned along the pipeline with a suitable signal for measurements. When the measurements have been completed, data of the individual flow sensors is transferred to the control unit. On board the control unit the data is stored in a suitable storage unit and data evaluation is performed with an arithmetic processor. This processor calculates, based on the data of velocity v and fluid magnetization $M_1, M_2, \ldots, M_n$, the instantaneous mass flow rates of the individual components of the flow. A suitable time base allows the integration of these instantaneous flow rates to yield the total mass flow of the individual components flown through the pipe since summation started. The time base is also needed to trigger the measurements of the individual NMR (or EMR) flow sensors.

As the gain of net magnetization is governed by the $T_1$-relaxation effect, the achieved extent of fluid magnetization depends on the $T_1$-relaxation time of the individual components and how much time the material did have to remain in the external magnetic field $H_0$. Obviously, in a flow situation, the time the fluid has to get magnetized, depends on the velocity of the flow. To get good accuracy with the invented measurement apparatus, it is desirable that the multi-component fluid is almost fully magnetized when it leaves the measurement arrangement. To achieve this, the total length of the magnet arrangement needs to be chosen correspondingly.

According to the present invention, there is provided an apparatus for measuring individual mass flow rates of fluid components of a multi-component flow, irrespective of flow direction wherein the flow consists of two or more components each with different products of flow velocity and longitudinal relaxation time, and wherein the apparatus comprises magnet means for forming a magnetic field perpendicular to the flow direction along the pipe, the field being generated by a plurality of polarizing magnets, a detection magnet located between any respective two polarizing magnets, a pipe of non magnetic material in the field of the polarizing and detection magnets; a respective number of RF-coils each placed in the field of a respective detection magnet and disposed at right angles to the field direction and wound around the non-magnetic pipe, an NMR or EMR detection apparatus connectible or connected to a respective one of said coils, the apparatus detecting magnetization and velocity of the flowing material, means for selectively initiating operation of each said NMR or EMR detection apparatus, and means for measurement of, and for collecting, storing and evaluating information on, velocity and magnetization of each NMR or EMR detection apparatus, thereby to compute the mass of flow of the individual components of the flow.

Preferably said arrangement of detection and polarizing magnets is of such length as to produce a multi-exponential gain of magnetization along the length of the non-magnetic pipe.

The arrangement of detection and polarizing magnets may be of such length as to give substantial saturation when the multi-component flow exits the apparatus.

The polarizing magnets may be of such length as to place the interspaced detection magnets at optimum positions along the pipe, thereby to allow sampling of the multi-exponential magnetization curve with good resolution.

Said detection magnets may be of such size as to house said RF-coils.

When there are a plurality of NMR or EMR detection apparatuses, they may be so controlled that only one may be operated at any instant, using a suitable time base.

The means to control the detection apparatuses may read in the magnetic resonance data containing information on flow velocity and magnetization, after the measurement procedure of an individual NMR or EMR detection apparatus has been completed.

The control means may include means for storing the magnetic resonance data of the individual NMR or EMR detection apparatuses.

The control means may comprise an arithmetic or other processor to calculate, based on the velocity and magnetization readings, the instantaneous mass flow rates of the individual components of the flow.

The control means may comprise a time base to integrate the instantaneous mass flow rates yielding the total flow from the individual components.

According to a second aspect of the present invention, there is provided an apparatus for measuring individual mass flow rates of a multi-component fluid flow, irrespective of flow direction, wherein the flow comprises n components, each with a different product of flow velocity and longitudinal relaxation time, and wherein the apparatus comprises magnet means for forming a magnetic field perpendicular to the flow direction along a pipe, the field being generated by n+1 polarizing magnets, n detection magnets each located between two polarizing magnets, a pipe of non-magnetic material in the field of the polarizing and detection magnets, n RF coils located in the field of said detection magnets at right angles to the field direction and wound around the non-magnetic pipe, one NMR or EMR detection apparatus connected periodically to each of said coils via a switch unit, the apparatus giving information on magnetization and velocity of the flowing material, control means for switching said at least one NMR or EMR detection apparatus to a respective RF-coil, for triggering the apparatus for measurement and for collecting, storing and evaluating the information on velocity and magnetization of the NMR or EMR detection apparatus.

The arrangement of detection and polarizing magnets is preferably of such length as to produce a multi-exponential gain of magnetization along the non-magnetic pipe.

The arrangement of detection and polarizing magnets is of suitable length to give substantial saturation when the multi-component flow leaves the measurement apparatus.

The polarizing magnets are advantageously of suitable length to locate the interspaced detection magnets at optimum positions along the pipe, to allow the sampling of the multi-exponential magnetization curve with good resolution.

Preferably said detection magnets are of such size as to enable housing therewithin of said RF-coils.

The control means may comprise a switch unit to connect and disconnect an NMR or EMR detection apparatus to any one or more of said RF-coils.

The control means advantageously reads in magnetic resonance data containing information on fluid velocity and magnetization, after the measurement procedure of the NMR or EMR detection apparatus has been completed.

In this case the control means includes means for storing the magnetic resonance data of the NMR or EMR detection apparatus individually for each connected RF-coil.

The control means may comprise an arithmetic or other processor to calculate, based on the velocity and magnetization readings, the instantaneous mass flow rates of the individual components of the flow.

The control means may comprise a time base to integrate the instantaneous mass flow rates yielding the total flow from the individual components.

According to a third aspect of the present invention, there is provided a method of determining the individual mass flow rates of a multi-component flow, wherein the flowing multi-component substance consists of n components, each having different products of flow velocity and longitudinal relaxation time, the method comprising the steps of creating a magnetic field across the path of said flow, the field having a specified field strength which is the same for all polarization and detection magnets, generating a multi-exponential gain of magnetization for any desired one of the components of the flow along the main flow direction, by magnetizing the oncoming multi-component flow until the components of the flow are substantially saturated, operating the or each NMR or EMR detection apparatus such that only one of the RF-coils is interrogating the multi-component flow at any instant, measuring flow velocity and magnetization of n flowing elements of interest an n positions within the arrangement of polarization and detection magnets, the measured data of flow velocity and magnetization being dependant on flow rates and composition of the flow.

Preferably the calculated equilibrium magnetization of the individual components of the flow provide a measure of the mass concentrations of each component of the flow.

The product of velocity and equilibrium magnetization of the individual components may provide a measure of the instantaneous mass flow rate of each individual component of the flow.

The measure of the instantaneous mass flow rates of the individual components of the flow may be integrated to provide a measure of the total flow.

The method may include the step of generating a multi-exponential gain of magnetization for an element of interest, in the magnet arrangement, against the main flow direction, by magnetizing the back flowing multi-component flow until the components of the flow are substantially saturated.

Advantageously the product of velocity and equilibrium magnetization of the individual components provides a measure of the instantaneous mass flow rates of the back flowing individual components of the flow.

In this case, the measure of the instantaneous mass flow rates of the individual components of the flow is integrated to provide a measure of the back flowing total flow.

Embodiments of the present invention will now be described by way of example and with reference to the accompanying drawings, in which.

Figure 1:
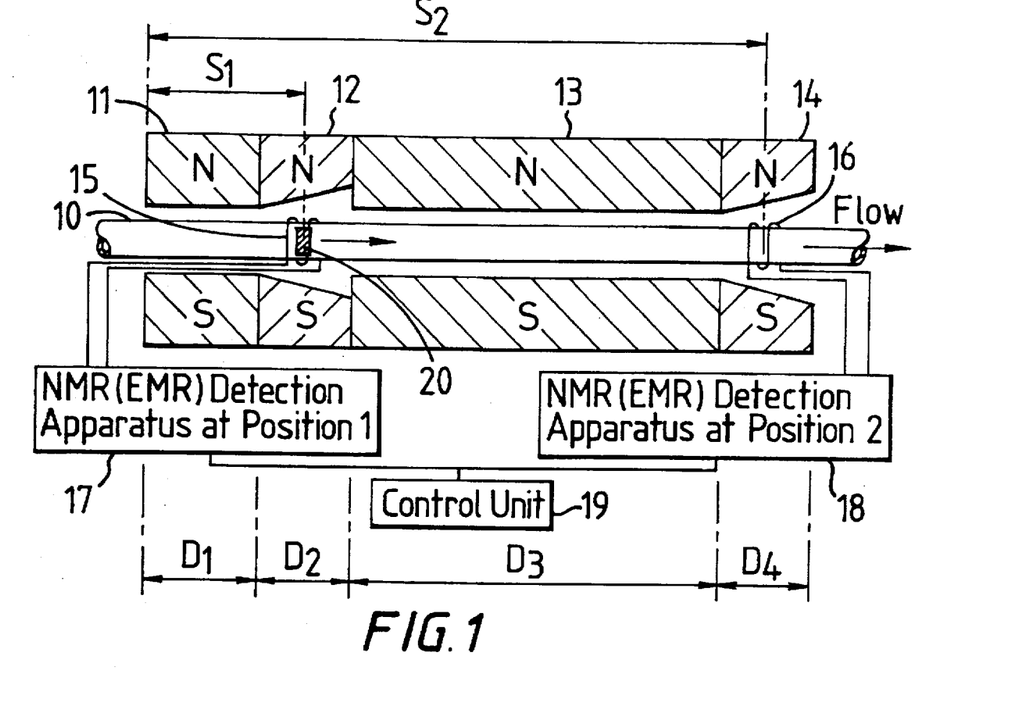
FIG. 1 is a view showing the apparatus for measuring the individual mass flow rates of a two-component flow consisting of a non-magnetic pipe placed into the magnetic field of an arrangement of two NMR (or EMR) flow sensors and two polarizing magnets.

Attention is first directed to FIG. 1 of the drawings. In FIG. 1, the numeral 10 identifies a pipe or conduit which carries a flowing multi-component fluid which is to be measured for flow velocity and fluid magnetization. At this portion, the pipe 10 has some material flowing in it, the material typically being a mixture of oil and water. The portion of the pipeline shown in FIG. 1 is preferably made of non-magnetic material so that lines of magnetic flux can pass through the pipe 10.

The pipe 10 is placed in a magnet arrangement consisting of two polarizing magnets 11 and 13, and two detection magnets 12 and 14. All magnets 11, 12, 13, and 14 have to have the same orientation in field direction. In FIG. 1, the north pole pieces of the magnets 11 12, 13 and 14 are placed on top of the pipe 10 and the south pole pieces at the bottom.

Needless to say, the common orientation could also be reversed. All magnets 11, 12, 13 and 14 impose a magnetic field $H_0$ on the flow which is perpendicular to flow direction. As the measurement principle of this invention is explained based on gradient field methods, the magnets 12 and 14 are shown tapered so that the air gap between the poles changes along the flow direction. In FIG. 1 the air gap of magnet 12 and 14 is shown to increase along flow direction which is identified as a negative gradient. The magnets 12 and 14, of course, could also provide a positive gradient along the flow direction which would mean a decrease of the air gap along flow direction. Provided suitable alternate flow sensing techniques are used, which do not rely on gradient fields, it may also be appropriate to manufacture the detection magnets 12 and 14 with zero field gradient, i.e. the magnetic field would be homogenous as the magnetic field of the polarizing magnets 11 and 13.

The length $D_1$ of polarizing magnet 11, the length $D_2$ of detection magnet 12, the length $D_3$ of polarizing magnet 13 and the length $D_4$ of detection magnet 14 are subject to operational requirements of the flow meter. If, for example, an oil/water mix with an average flow velocity of 3 m/s and a longitudinal relaxation time of 0.3 s for oil and 3.0 s for water is to be measured with good accuracy, magnet dimensions should be (for an external pipe diameter of 40 mm) as follows:

$D_1$=1.500 mm
$D_2$=150 mm
$D_3$=12,000 mm
$D_4$=150 mm

These dimensions, of course, need to be varied if the flow parameters change, e.g. average fluid velocity or the $T_1$-relaxation times of the individual components.

In the centre of the detection magnets 12 and 14 two RF-coils 15 and 16 generating oscillating magnetic fields at right angles to the external magnetic field $H_0$ are concentric around the pipe 10. They are located at a distance $S_1$ and $S_2$ from the entrance of the first polarizing magnet 11. The coils 15 and 16 are connected to corresponding NMR (or EMR) detection apparatuses 17 and 18 and form two NMR (or EMR) flow sensors. The two NMR (or EMR) flow sensors 17 and 18 are connected to a control unit 19 which controls the function of the two NMR flow sensors 17 and 18. With this control unit a fluid element 20 travelling through the pipe can be measured either at position 1 or position 2. Important for all the following considerations is that the dimensions of this fluid element, in general, are defined to be identical with the dimensions of the effective RF field of the coils 15 or 16, which excite the nuclei or free electrons of the flow for measurement purposes. Because the dimensions of the effective RF field of coils 15 and 16 are identical and the sensitivity of the NMR (or EMR) detection apparatuses 17 and 18 is chosen to be the same at both positions 1 and 2, the flow sensors give identical readings for fluid magnetization in a zero flow situation allowing the readings of magnetization and fluid velocity to be correlated, in a flow situation, in an advantageous manner.

The advantage of using an arrangement of different magnets for fluid polarization and NMR or (EMR) measurements, instead of one single magnet block, is an economic one. In general, to detect a useful NMR (or EMR) signal, a good quality magnetic field needs to be provided by the detection magnets 12 and 14. If field gradient methods are used, it is desirable to have a very linear gradient along the flow direction with an exactly rectangular field distribution. If alternate flow sensing methods are used, which do not rely on field gradients, it is desirable to have a very homogeneous magnetic field in the detection magnets 12 and 14. This makes detection magnets relatively expensive to manufacture.

For fluid polarization, however, requirements for the polarizing magnets 11 and 13 are much lower. If these magnets are manufactured to a lower standard with regards to their field homogeneity, considerable savings for the polarizing magnets 11 and 13 can be made in this invention, as these magnets in general need to be much longer than the detection magnets.

Figure 2:
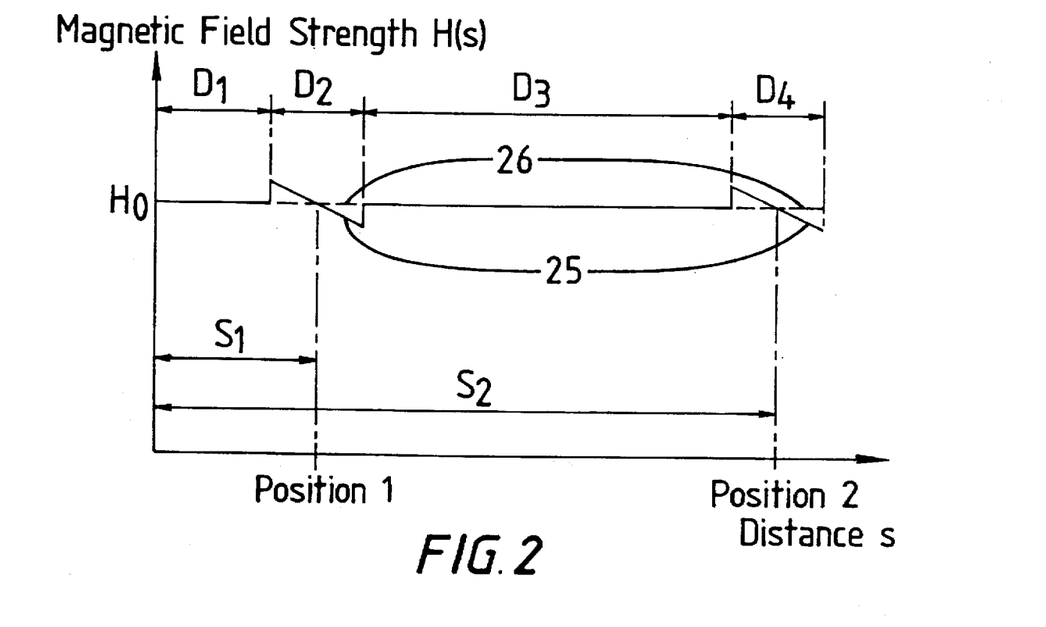
FIG. 2 shows the idealized and the actual field strength in the preferred embodiment of FIG. 1.

Attention is now directed to FIG. 2 of the drawings. FIG. 2 plots the local magnetic field strength H(s) against the distance s. The local field strength H(s) is the field strength of the external magnetic field a nuclei or free electron experiences at distance s from the entrance of the magnet arrangement of FIG. 1.

In this invention, the field strength $H_0$ of the two polarizing magnets 11 and 13 and the average field strength of the two detection magnets 12 and 14 of FIG. 1 are chosen to be equal. A possible use of a field gradient for the detection magnets causes a slight deviation of H(s) from the average field strength $H_0$, over the sections $D_2$ and $D_4$, as line 25 illustrates in FIG. 2. However, this deviation can be assumed to be negligible, and the strength of the local magnetic field H(s) in the magnet arrangement at distance s can be regarded as constant for two reasons: First, relatively small gradients for the detection magnets can be used (e.g. for the phase shift method, documented in U.S. Pat. No. 4,536,711, gradients as small as 300 mG/cm are adequate for an average field strength of $H_0$=4700 Gauss in the detection magnet). Second, the geometrical length of the detection magnets along flow direction is small compared to the length of the polarizing magnets, so the field strength experienced by a fluid element travelling through the magnet arrangement will be dominated by the constant field strength $H_0$ of the polarizing magnets. As a consequence, the field strength H(s) along the distance s can be idealized to be constant as depicted by line 26 in FIG. 2.

As an alternative, homogenous fields can be used instead of gradient fields for the detection magnets, if appropriate NMR (or EMR) flow sensing techniques used which do not rely on gradient fields. In such a case, the local field strength H(s) along distance $D_2$ and $D_4$ of FIG. 2 is constant and equal to the field strength of the polarizing magnets along distance $D_1$ and $D_3$, anyway.

It has been discovered in this invention that the use of a magnet arrangement as depicted in FIG. 1 is very advantageous. When the flowing material enters this magnet arrangement, a magnetization process starts. To give an example, for H-nuclei of a measured water sample, the gain of magnetization when brought into an external magnetic field $H_0$ can be described by:

$$M_1(t) = M_{01} (1 - e^{-\frac{t}{T_{11}}}) \quad (1)$$

where $M_1(t)$ is the magnetization of water in time, $M_{01}$ the equilibrium magnetization of the water sample in thermal equilibrium, t the time and $T_{11}$ the longitudinal relaxation time of water.

For reasons of simplicity, the sample of water may be contained in the fluid element 20 in FIG. 1. If this fluid element 20 moves through the magnet arrangement, the linear movement of the flow changes this exponential gain of magnetization in time into an exponential gain of magnetization along the pipe 10. Provided the fluid velocity v of water is a constant, the local magnetic field strength H(s)

along the pipeline is constant, and the velocity distribution profile is a rectangular one, time t can be substituted with s/v resulting in:

$$M_1(s) = M_{01}(1 - e^{-\frac{s}{vT_{11}}}) \quad (2)$$

where $M_1(s)$ is the magnetization of water at distance s, s the distance of the fluid element from the entrance of the magnet arrangement and v the velocity of the fluid element.

Equation (2) can also be interpreted to describe the magnetization not only for a single fluid element but also for the whole flow. A stationary single component flow produces a mono-exponential curve of magnetization along the pipeline where the local magnetization $M_1(s)$ of the flow is known at every arbitrary distance s from the entrance from the magnet arrangement.

Figure 3:
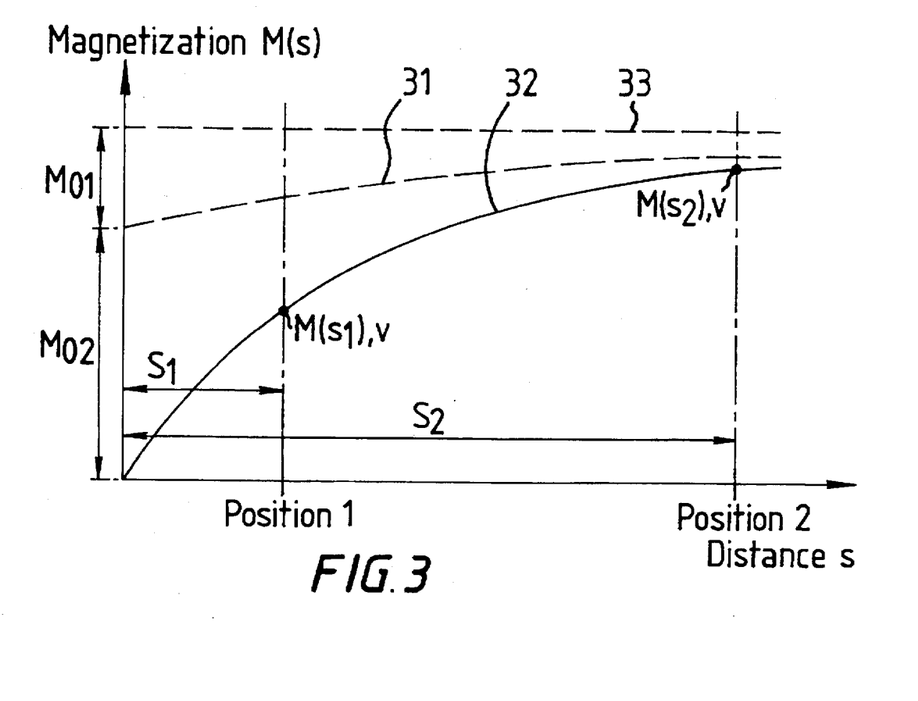
FIG. 3 shows the bi-exponential gain of fluid magnetization in the apparatus of FIG. 1.

Continuing on with the description, attention is next directed to FIG. 3 of the drawings. FIG. 3 plots the gain of magnetization M(s) of a fluid element in a two-component flow, with substantially different products of velocity v and longitudinal relaxation time $T_1$, while it is moving along distance s in the magnet arrangement (s is the distance of the fluid element from the entrance of the magnet arrangement). The two-component flow may be, as an example, a flowing oil/water mixture.

If a multi-component flow consists of several components with substantially different products of velocity v and longitudinal relaxation time $T_1$, such as in a flowing oil/water mixture, the mono-exponential curve described by equation (2) changes into a bi-exponential curve. This is due to superposition of two magnetization processes which, in essence, happen at different rates for the individual components of the flow (in the example, the subscript 1 identifies the water component and subscript 2 the oil component). An illustration of this can be seen in FIG. 3. Both components of the fluid element try to reach their equilibrium magnetization, indicated as $M_{01}$ and $M_{02}$ in FIG. 3, while they are travelling along the field of the magnet arrangement. The sum of the equilibrium magnetization $M_{01}$ and $M_{02}$ is indicated by line 33 of FIG. 3. Since component 1 is magnetized at a significantly slower rate, the gradient of curve 31, indicating the gain of magnetization for component 1, is smaller than the gradient of curve 32, indicating the total gain of the total magnetization resulting from both components 1 and 2 (the gradients of the curves 31 and 32 are compared at identical position s).

By measuring fluid velocity v and fluid magnetization $M(s_1)$ and $M(s_2)$ at position 1 and 2 (compare FIG. 3) with two NMR (or EMR) flow sensors it is possible to analyze the unique multi-exponential shape of curve 32 and reconstruct the magnetization process for the individual components. This in turn, yields the equilibrium magnetization of the individual components which provides a measure of the individual mass flow rates as will be seen later on.

Assuming there is no slip between the individual components of the flow and the outlined conditions of equation (2) are met, the total magnetization M(s) of the flow at an arbitrary distance s can be, similar to equation (2), expressed as:

$$M(s) = M_{01}(1 - e^{-\frac{s}{vT_{11}}}), M_{02}(1 - e^{-\frac{s}{vT_{12}}}) \quad (3)$$

where $M_{02}$ is the equilibrium magnetization of the second component in a measured fluid element, and $T_{12}$ the longitudinal relaxation time of the second component (oil, in this example).

Equation (3) is a general equation and describes the local magnetization M(s) of a fluid element for every position s along the pipe. The magnetization in the effective RF-field of the NMR (or EMR) sensors at position a and position 2, in particular, can be expressed as, $$M(s_1) = M_{01}(1 - e^{-\frac{s_1}{vT_{11}}}) + M_{02}(1 - e^{-\frac{s_1}{vT_{12}}}) \quad (4)$$

and $$M(s_2) = M_{01}(1 - e^{-\frac{s_2}{vT_{11}}}) + M_{02}(1 - e^{-\frac{s_2}{vT_{12}}}) \quad (5)$$

where $s_1$ is the distance from the entrance of the magnet arrangement to the effective RF-field of the flow sensor at position 1, and $s_2$ is the distance from the entrance of the magnet.

The equation system of equ. (4) and (5) can be solved in order to determine the values of the equilibrium magnetization $M_{01}$ and $M_{02}$:

$$M_{01} = \frac{M(s_1)(1 - e^{-\frac{s_2}{vT_{12}}}) - M(s_2)(1 - e^{-\frac{s_1}{vT_{12}}})}{(1 - e^{-\frac{s_1}{vT_{11}}})(1 - e^{-\frac{s_2}{vT_{12}}}) - (1 - e^{-\frac{s_2}{vT_{11}}})(1 - e^{-\frac{s_1}{vT_{12}}})} \quad (6)$$

$$M_{02} = \frac{M(s_1)(1 - e^{-\frac{s_2}{vT_{11}}}) - M(s_2)(1 - e^{-\frac{s_1}{vT_{11}}})}{(1 - e^{-\frac{s_1}{vT_{12}}})(1 - e^{-\frac{s_2}{vT_{11}}}) - (1 - e^{-\frac{s_2}{vT_{12}}})(1 - e^{-\frac{s_1}{vT_{11}}})} \quad (7)$$

A calculation of $M_{01}$ and $M_{02}$, based on the measured values of magnetization $M(s_1)$, $M(s_2)$ and velocity v is possible if following conditions are met:

During the "blow out time" (=time to exchange completely the enclosed fluid volume in the magnet arrangement with fresh material) any change in the concentrations of the components and the fluid velocity has to be small enough to be neglected.

The distances $s_1$ and $s_2$ of the NMR (or EMR) flow sensors from the entrance of the magnet arrangement have been determined previously.

Also, a preliminary calibration process has been carried out to determine the longitudinal relaxation times $T_{11}$ and $T_{12}$ of the individual components for the specified field strength $H_0$.

Determining the equilibrium magnetization $M_{01}$ and $M_{02}$ of the individual components is advantageous because these values can be converted into mass flow rates:

$M_{01}$ is proportional to the number of nuclei (or free electrons) embedded in component 1 of the measured fluid element, and $M_{02}$ is proportional to the number of nuclei (or free electrons) embedded in component 2 of the measured fluid element. For fluids, the number of nuclei (or free electrons), in a reference volume, generally is a constant.

The number of nuclei in a reference volume, also can be associated with the number of molecules within that reference volume, for a substance of given chemical structure. The number of molecules, in turn, can be associated with the mass of the substance enclosed in that reference volume.

Hence, it follows, that the equilibrium magnetization $M_{01}$ and $M_{02}$ is a measure of the mass of each component present in the measured fluid element. Together with the velocity value v, $M_{01}$ and $M_{02}$ can be converted easily into mass flow rates by means of suitable calibration factors $c_1$ and $c_2$:

$$\frac{\partial m_1}{\partial t} = c_1 M_{01} v \quad (8)$$

-continued $$\frac{\partial m_2}{\partial t} = -c_2 M_{02} v \qquad \frac{\partial m_2}{\partial t} = c_2 M_{02} v \qquad (9)$$

Figure 4:
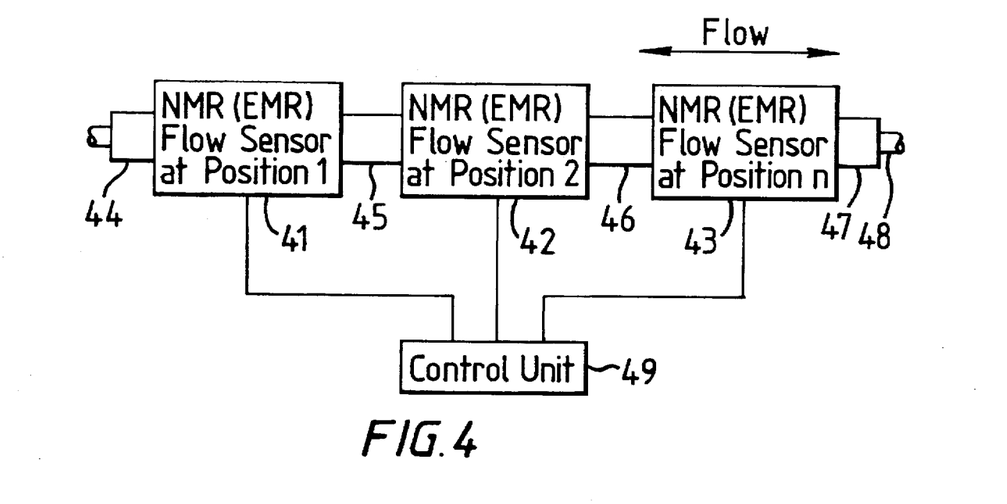
FIG. 4 is an advantageous modification of the apparatus for measuring the individual mass flow rates of a multi-component flow of FIG. 1 consisting of an arrangement of n NMR (or EMR) flow sensors and n+1 polarizing magnets. The modification allows measuring a multi-component flow with n components in both flow directions.

Attention is next drawn to FIG. 4 which shows an advantageous modification of the measurement apparatus of FIG. 1. So far, method and apparatus for measurement of the individual mass flow rates of a two-component flow were described. The apparatus, however, could also measure a flow with more than two components, provided the product of velocity v and longitudinal relaxation time $T_1$ is substantially different for each component of the flow. Only additional NMR (or EMR) flow sensors, at least one for each component, need to be added at a suitable position along the pipeline. In FIG. 4, three NMR flow sensors 41, 42 and 43 connected to a control unit 49, and three polarizing magnets 44, 45 and 46, together with a non-magnetic pipe 48, were arranged to measure a three-component flow. There is no limit to the number of components in the flow, so this in fact could also be n flow sensors and n polarizing magnets to measure a multi-component flow with n components. The algorithm for the quantitative determination of the individual mass flow rates is similar to the one previously described, except that the equation system of two equations 4 and 5, with two unknowns, turns into an equation system of n equations with n unknowns.

Another advantageous modification of the apparatus of FIG. 1 is to add another polarizing magnet 47, of suitable length, at the end of the magnet arrangement of FIG. 4. This modification makes the measurement apparatus symmetrical and allows the measurement of a multi-component flow in both flow directions, as will be illustrated with the graphs of FIG. 5 and FIG. 6.

Figure 5:
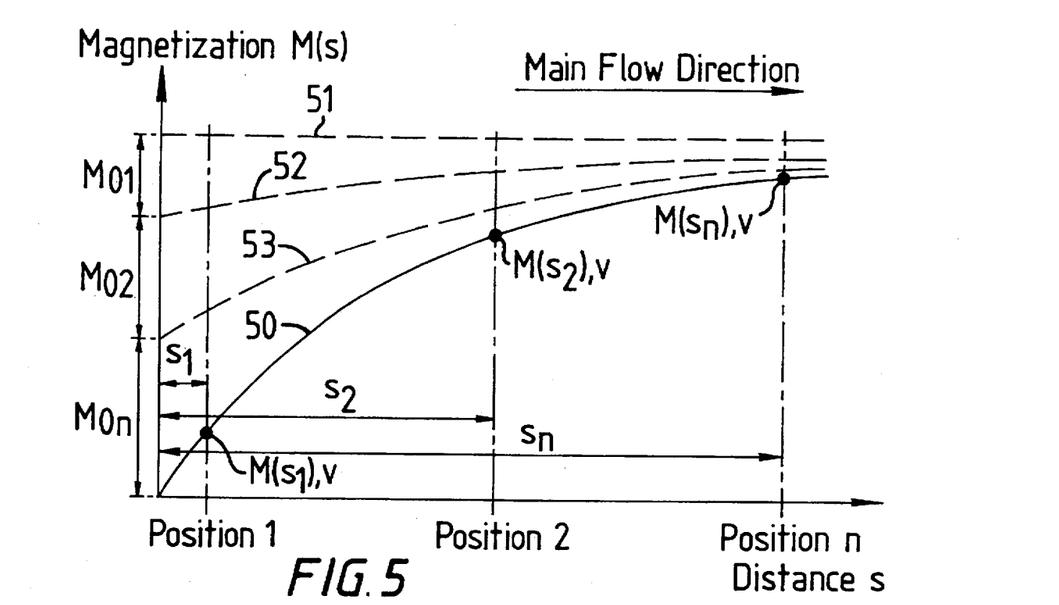
FIG. 5 shows the multi-exponential gain of fluid magnetization in the apparatus of FIG. 4 for the main flow direction.

Attention is next directed to FIG. 5 which plots the gain of magnetization M(s) of a fluid element in a multi-component flow consisting of n components while it is moving along distance s in main flow direction (distance s in this case, is measured from the left entrance of the magnet arrangement of FIG. 4). As the product of velocity v and longitudinal relaxation time $T_1$ is substantially different for each component of the flow, the magnetization curve 50 of FIG. 5 has a multi-exponential shape. This is due to superposition of magnetization processes which, in essence, happen at different rates for the individual components of the flow. The gain of magnetization of component 1 is indicated by curve 52, the resulting gain of magnetization of component 1+2 is indicated by curve 53, and the total gain of magnetization of all components is indicated by curve 50.

The individual components of the flow try to reach their equilibrium magnetization $M_{01}, M_{02}, \ldots, M_{0n}$ while they are moving along field of the magnet arrangement. The total sum of the equilibrium magnetization $M_{01}, M_{02}, \ldots, M_{0n}$ is indicated by curve 51. Similar to the previously described algorithm, the equilibrium magnetization $M_{01}, M_{02}, \ldots, M_{0n}$ can be determined by measuring the flow at n positions along the pipeline with the apparatus of FIG. 4. With the values of $M(s_1), M(s_2), \ldots, M(s_n)$ and v, measured at position 1, 2, ..., n in the magnet arrangement, the individual mass flow rates can be calculated similar to the equations (6)–(9). Important is only that the corresponding values for the distance $s_1, s_2, \ldots, s_n$ are referred from the left entrance of the magnet arrangement.

Figure 6:
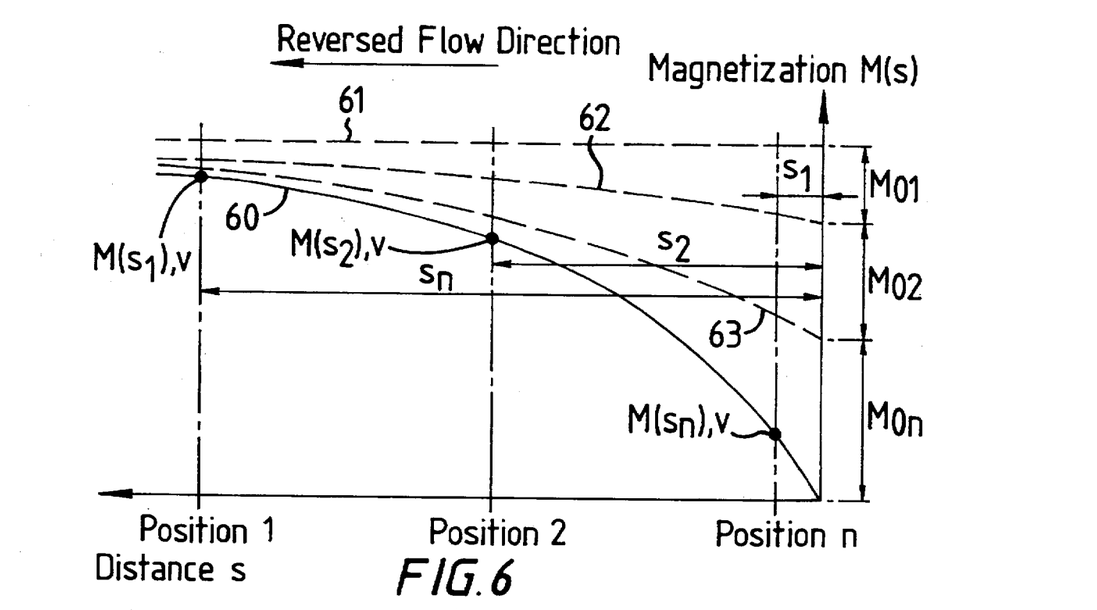
FIG. 6 shows the multi-exponential gain of fluid magnetization in the apparatus of FIG. 4 for the reversed flow direction.

Attention is next directed to FIG. 6 which plots the gain of magnetization M(s) of a fluid element in a multiphase flow of n components while it is moving along distance s in reversed flow direction (distance s in this case, is measured from the right entrance of the magnet arrangement of FIG. 4). The total equilibrium magnetization of all components is indicated by curve 61.

Similar to FIG. 5, the magnetization curve 60 has a multi-exponential shape since the product of velocity v and longitudinal relaxation time $T_1$ is substantially different for each component of the flow. In fact, the curve 60 indicating the total gain of magnetization of all components is only a mirror image of curve 50 of FIG. 5. Curve 62 (indicating the gain of magnetization of component 1) and 63 (total gain of magnetization of component 1+2) of FIG. 6 are also a mirror image of curve 52 and 53 of FIG. 5.

Identical to procedure described for the main flow direction, the equilibrium magnetization $M_{01}, M_{02}, \ldots, M_{0n}$ and the individual mass flow rates can be determined in the same way. The only difference is that in reversed flow direction the values for the distance $s_1, s_2, \ldots, s_n$ are referred from the right entrance of the magnet arrangement of FIG. 4.

With such a modified procedure for data evaluation, multiphase flow can be measured in both flow directions. This is of particular importance if the multi-component flow consists of compressible components, such as an additional gaseous component. In such a flow, longitudinal oscillations in the pipe system are induced which can reverse the flow direction for a fraction of the pulsation period. The symmetrical design of the measurement apparatus ensures that not only the material flowing in the main direction is measured correctly but also the material flowing backwards. In such a flow situation, the correct total flow of the individual components can is obtained by integrating the individual mass flow rates, for both flow directions, over the corresponding time period and subtracting the back flowing mass flow from forward flowing mass flow.

Principally, there are many NMR (or EMR) sensing techniques capable of measuring fluid magnetization and velocity of the flow simultaneously, and the multi-component flow meter of FIG. 4 could be built in various ways. In this invention, virtually any NMR (or EMR) sensing technique is technically viable, as long as it measures fluid magnetization and fluid velocity with n flow sensors at n positions in a magnet arrangement similar to FIG. 1 and FIG. 4.

For illustration purposes, the invented measurement apparatus of FIG. 1 and FIG. 4 is based on the phase shift of a Hahn spin-echo in a gradient field. Some of the details are recaptured briefly from U.S. Pat. No. 4,536,711. It is fundamental for the method that the frequency of the magnetic resonance signal changes proportionately to field intensity. In a fixed gradient, the change of the emitted NMR or EMR frequency signal is a linear function of flow velocity.

Figure 7:
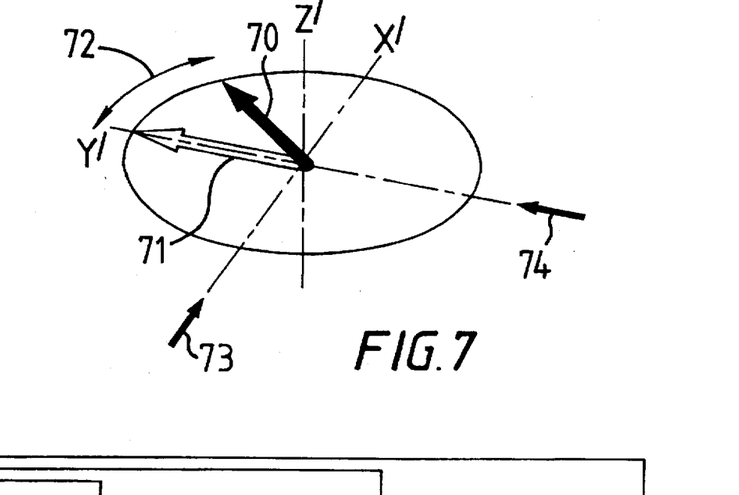
FIG. 7 is a diagram of the rotating frame of reference illustrating the phase shift of the spin-echo for a sample of spins moving along a gradient field.

Attention is next directed to FIG. 7 of the drawings which shows the magnetization vector 70 of a spin-echo in a rotating frame of reference.

With a suitable excitation pulse (for example a 90° pulse), a volume of material of the flow can be activated for measurement. After time τ, the spins of the selected activated volume are refocussed with, for example, a 180°- pulse. If the spin-echo, occurring after 2τ, is sampled with a two channel receiver, the reference frequency of the two channels 73 and 74 being out of phase, e.g. by 90°, information on phase and amplitude of the NMR or EMR signal is obtained.

If the excited volume has moved along a field gradient during time 2τ, the magnetization vector 70 of the spin-echo will show a different phase compared to a stationary excited volume, represented by magnetization vector 71. In a linear gradient, the phase shift 72 is proportional to flow velocity, thus giving a measure of flow velocity. The amplitude of the magnetization vector 70 give a measure of flow magnetization M.

Alternatively, the flow magnetization M can also be measured by determining the peak of the FID signal following the initial excitation pulse.

A particular advantage of using this flow sensing method is the fact that the phase shift of the NMR signal of the refocussed volume can be either positive or negative to the reference frequency of the excitation pulse, depending on flow direction. In that way, phase shift techniques not only yield the fluid magnetization and flow velocity but also the direction of the flow. This is particularly useful for a multi-component flow meter which is to measure in both flow directions as illustrated in the design of FIG. 4 of the drawings.

Figure 8:
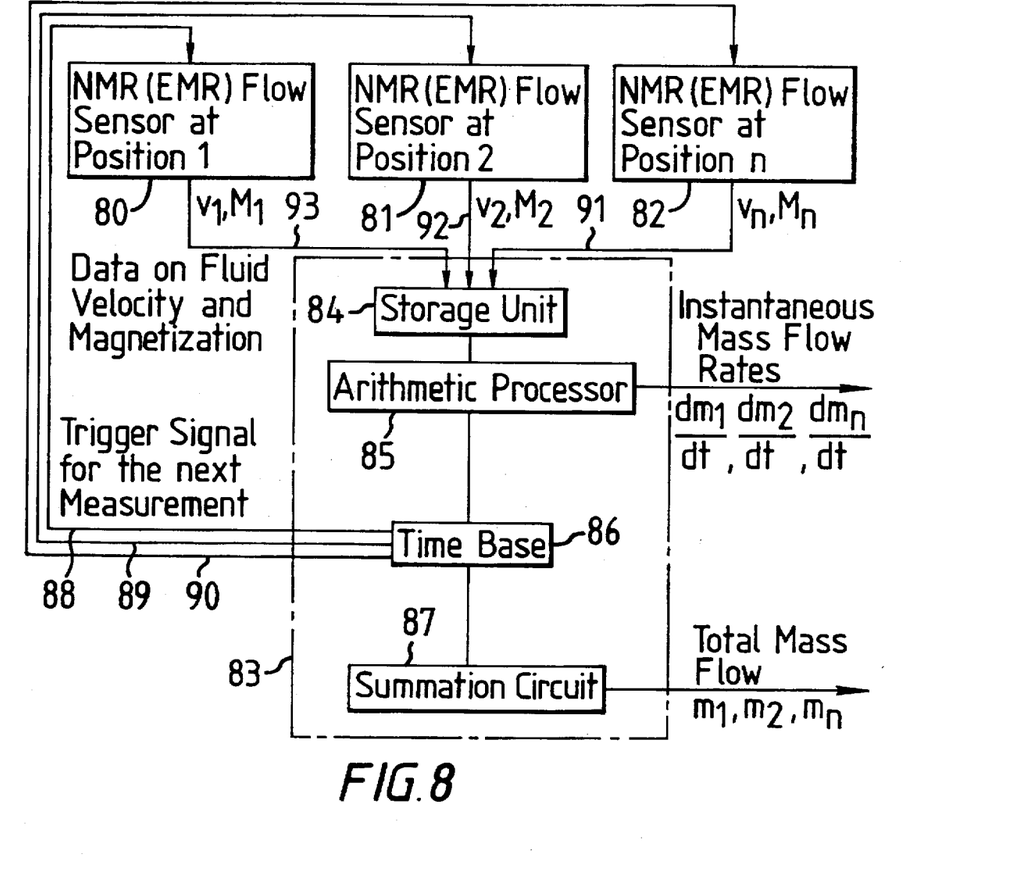
FIG. 8 is a block diagram showing the function of the control unit of the apparatus of FIG. 1 and FIG. 4.

Attention is next directed to FIG. 8 which is to illustrate the function of the control unit of the apparatus in FIG. 4. FIG. 8 shows a schematic block diagram of an arrangement of several NMR (or EMR) flow sensors 80, 81, 82 connected to a control unit 83 via conductors 88, 89, 90, 91, 92 and 93. The control unit 83, in turn, comprises a storage unit 84, an arithmetic processor 85, a time base 86 and a summation circuit 87.

In an arrangement of several NMR (or EMR) flow sensors, generally, there is the possibility of signal interference between the RF-coils of the flow sensors. They are physically aligned with one another and can be close, depending on the design. There is a risk of transmitting signals from the one coil to the neighbouring coils and vice versa. If the coils are long and have many turns, the risk of coil interference is increased. An interlaced operation is preferable to avoid direct coupling between the two coils. Principally, following conditions have to be met:

When one transmitter of the NMR (or EMR) flow sensors is on, all other transmitters are off.

The receiver of any NMR (or EMR) flow sensor can only be on if all transmitters are off to prevent any overload of the receiver units.

In practice, for the operation of the multi-component flow meter, following measurement procedure is suggested:

The control unit 83 with time base 86 sends a trigger signal to flow sensor 80 via conductor 88. Flow sensor 80 starts measuring by turning on its transmitter and irradiating a fluid element with one or several RF-pulses. The RF-pulses are ended by turning off the transmitter after the pulse time (usually a couple of μs). After some dead time has elapsed after each pulse, the receiver of flow sensor 80 is enabled, and the FID or spin echo are sampled in sensor 80. Then, the sampled data on flow (which can be the raw signal or explicitly fluid velocity $v_1$ and fluid magnetization $M_1$) is transferred to the storage unit 84 of control unit 83 via conductor 93. After the measurement cycle has been completed control unit 83 can trigger the next flow sensor 81 for measurement, and so on.

The sampled data of the flow sensors 80, 81 and 82 stored in storage unit 84 can be accessed by the arithmetic processor 85 for data evaluation. Based on the discussed algorithms, it calculates the instantaneous mass flow rates of the individual components of the multi-component flow. With the time base 86 and a summation circuit 87 these instantaneous flow rates can be integrated to give the total mass flow of the individual components of the multi-component flow.

Figure 9:
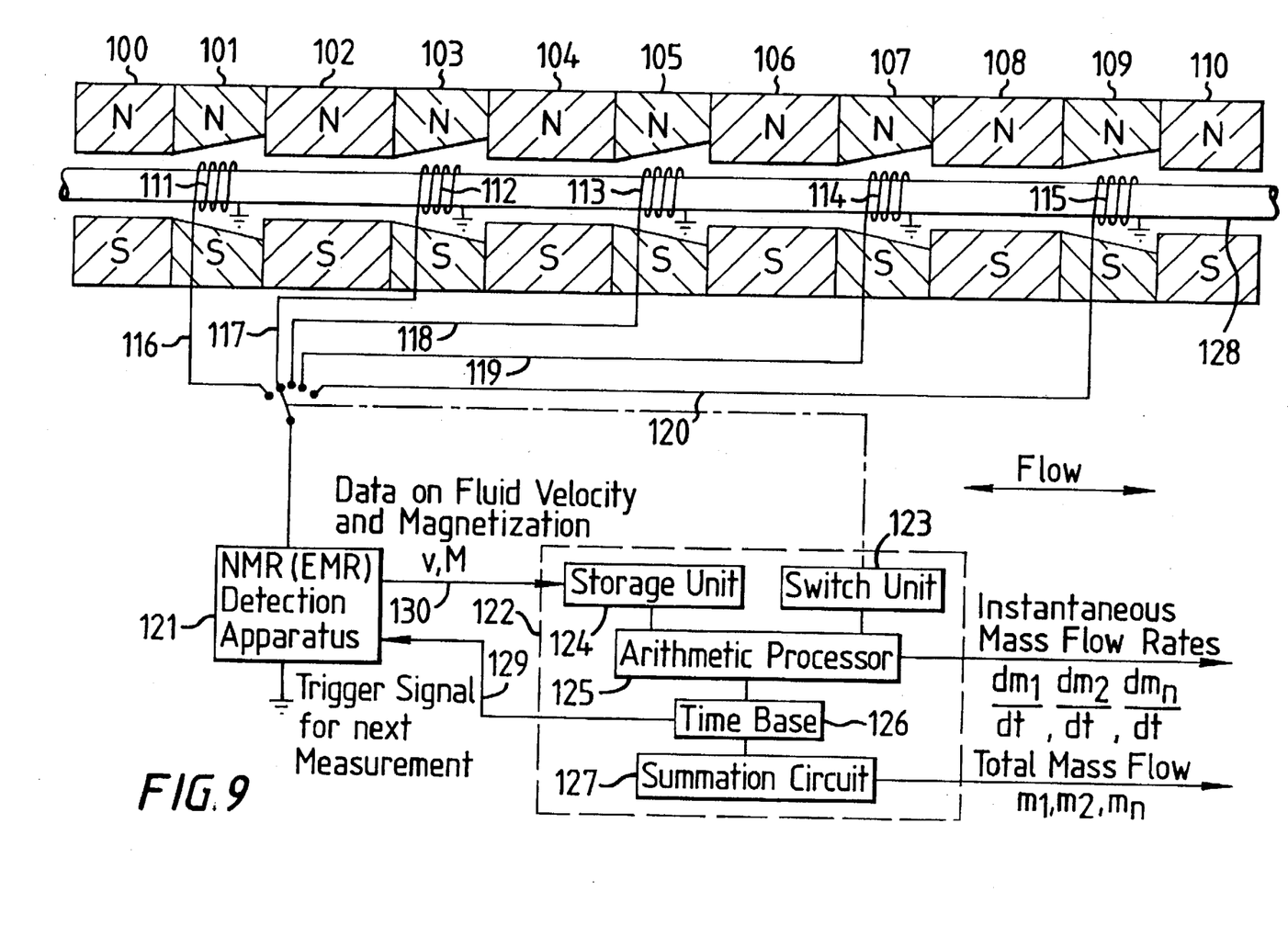
FIG. 9 is a view showing the apparatus of FIG. 4 further modified to operate the RF-coils of all NMR (or EMR) flow sensors with only one single NMR (EMR) detection apparatus.

A more elegant way of operating the multi-component flow meter in the same interlaced mode is shown in FIG. 9. Similar to FIG. 1 and FIG. 4, an arrangement of several polarizing magnets 100, 102, 104, 106, 108, 110 and several detection magnets 101, 103, 105, 107, 109 houses a non-magnetic pipe 128. Around the pipe 128 several RF-coils 111, 112, 113, 114 and 115 are winded and placed at corresponding positions in the detection magnets 101, 103, 105, 107, 109. These coils, in turn, can be connected to a NMR (or EMR) detection apparatus 121 via cables 116, 117, 118, 119 and 120, and interrogate the multi-component flow for fluid magnetization and velocity at several positions in the pipe.

Because it is desirable to operate the coils in an interlaced mode anyway, only one NMR (or EMR) detection apparatus 121 is sufficient to perform the same task as several NMR (or EMR) detection apparatuses of FIG. 1 or FIG. 4. By connecting the NMR (or EMR) detection apparatus 121 periodically to the individual coils for measurement, significant savings for the electronic circuitry of the magnetic resonance detection apparatus can be made; especially if the multi-component flow meter houses very many coils.

With this advantageous modification, individual mass flow rates of a multi-component flow can be measured in very similar manner as previously described in FIG. 8. Again, a control unit 122 with time base 126 sends a trigger signal to the NMR (or EMR) detection apparatus 121 via conductor 129. The flow sensor, consisting of the NMR (or EMR) detection apparatus 121 and a connected RF-coil in the corresponding detection magnet, starts measuring by generating the desired pulse sequence. After the appropriate dead time, the detection apparatus samples the FID and the spin-echo. Then, the sampled data on flow (fluid magnetization M and fluid velocity v) is transferred to the storage unit 124 of the control unit 122 via conductor 130. This data, in turn, can be accessed by the arithmetic processor 125.

After a completed measurement cycle, switch unit 123 connects another RF-coil to the NMR (or EMR) detection apparatus 121 for measurement, and so on.

After sufficient readings of velocity and fluid magnetization, at different positions in the flow, have been taken the arithmetic processor calculates the instantaneous mass flow rates of the individual components based on the algorithms discussed. With the time base 126 and a summation circuit 127 these instantaneous mass flow rates can be integrated to give the total mass flow of the individual components of the multi-component flow.

What I claim is:

1. An apparatus for measuring individual mass flow rates of fluid components of a multi-component flow wherein the flow consists of at least two components each with different products of flow velocity and longitudinal relaxation time;

said apparatus comprising a pipe of non-magnetic material;

at least a first and a second polarizing magnet means external of said pipe for forming a magnetic field perpendicular to the flow direction along the pipe;

at least a first and a second detection magnet means located external of said pipe with one detection magnet between two polarizing magnet means;

at least a first and a second RF-coil placed in the filed of a detection magnet and disposed at right angles to the field direction and wound around the non-magnetic pipe;

a magnetic resonance detection apparatus operatively connectable to each said coil, the apparatus detecting magnetization and velocity of the flowing material;

means for selectively initiating operation of each said magnetic resonance detection apparatus; and means for measurement of, and for collecting, storing and evaluating information on velocity and magnetization of each magnetic resonance detection apparatus, thereby to compute the mass of flow on the individual components of the flow.

2. The apparatus according to claim 1, wherein the arrangement of detection and polarizing magnets extends along a length of the pipe sufficient to produce a multi-exponential gain of magnetization along the length of the non-magnetic pipe.

3. The apparatus according to claim 1, wherein the arrangement of detection and polarizing magnets extends along a length of the pipe sufficient to give substantial saturation when the multi-component flow exits the apparatus.

4. The apparatus according to claim 1, wherein the magnets are located at spaced positions along the pipe, thereby to allow sampling of the multi-exponential magnetization curve with good resolution.

5. The apparatus according to claim 1, wherein the detection magnets house said RF-coils.

6. The apparatus according to claim 1, wherein the magnetic resonance detection apparatus is NMR (nuclear magnetic resonance) detection apparatus.

7. The apparatus according to claim 1, wherein the magnetic resonance detection apparatus is EMR (electron magnetic resonance) detection apparatus.

8. The apparatus according to claim 1, wherein a time base is supplied to control each of a plurality of magnetic resonance detection apparatuses, so that only one may be operated at any instant.

9. The apparatus according to claim 8, wherein the means to control the detection apparatuses reads in the magnetic resonance data containing information on flow velocity and magnetization after the measurement procedure of an individual magnetic resonance detection apparatus has been completed.

10. The apparatus according to claim 8, wherein the control means includes means for storing the magnetic resonance data of the individual magnetic resonance detection apparatuses.

11. The apparatus according to claim 8, wherein the control means comprises a processor to calculate, based on velocity and magnetization readings, the instantaneous mass flow rates of the individual components of the flow.

12. The apparatus according to claim 11, wherein the processor is an arithmetic processor.

13. The apparatus according to claim 8, wherein the control means comprises a time base to integrate the instantaneous mass flow rates yielding the total flow from the individual components.

14. An apparatus for measuring individual mass flow rates of fluid components of a multi-component flow, irrespective of flow direction, and wherein the flow consists of n components each with a different product of flow velocity and longitudinal relaxation time;

said apparatus comprising a pipe of a non-magnetic material;

n+1 polarizing magnet means external of said pipe for forming a magnetic field perpendicular to the flow direction along the pipe;

n detection magnet means located external of said pipe with one detection magnet means between two polarizing magnet means;

n RF-coils each placed in the field of one detection magnet and disposed at right angles to the field direction and wound around the non-magnetic pipe;

magnetic resonance detection apparatus operatively connectable to each said coil, the apparatus detecting magnetization and velocity of the flowing material;

switch means for connecting periodically each RF coil to said magnetic resonance detection apparatus;

control means for selectively triggering operation of said magnetic resonance detection apparatus means for measurement of, and for collecting, storing and evaluating information on velocity and magnetization of said magnetic resonance detection apparatus, thereby to compute the mass of flow of each of the individual components of the flow.

15. The apparatus according to claim 14, wherein the arrangement of detection and polarizing magnets extends along a length of the pipe sufficient to produce a multi-exponential gain of magnetization along the non-magnetic pipe.

16. The apparatus according to claim 14, wherein the arrangement of detection and polarizing magnets extends along a length of pipe sufficient to give substantial saturation when the multi-component flow leaves the measurement apparatus.

17. The apparatus according to claim 14, wherein the detection magnets are located at spaced positions along the pipe to allow the sampling of the multi-exponential magnetization curve with good resolution.

18. The apparatus according to claim 14, wherein said detection magnets house said RF-coils.

19. The apparatus according to claim 14, wherein the means to control the detection apparatus reads in the magnetic resonance data containing information on flow velocity and magnetization after the measurement procedure of an individual magnetic resonance detection apparatus has been completed.

20. The apparatus according to claim 14, wherein the control means includes means for storing the magnetic resonance data of the individual magnetic resonance detection apparatuses.

21. The apparatus according to claim 14, wherein the control means comprises a processor to calculate, based on the velocity and magnetization readings, the instantaneous mass flow rates of the individual components of the flow.

22. The apparatus according to claim 21, wherein the process is an arithmetic processor.

23. The apparatus according to claim 14, wherein the control means comprises a time base to integrate the instantaneous mass flow rates yielding the total flow from the individual components.

24. The apparatus according to claim 14, wherein the magnetic resonance detection apparatus is NMR (nuclear magnetic resonance) detection apparatus.

25. The apparatus according to claim 14, wherein the magnetic resonance detection apparatus is EMR (electron magnetic resonance) detection apparatus.

26. A method of determining an individual mass flow rate of each fluid component of a multi-component flow wherein the flow consists of at least n components each with a different product of flow velocity and longitudinal relaxation time;

the method comprising the steps of creating a magnetic field, perpendicular to the flow direction, the field having a pre-determined substantially constant field strength;

generating a multi-exponential gain of magnetization for any one of the components of the flow along the main flow direction of magnetizing the on-coming multi-component flow until the components of the flow are substantially saturated;

providing n RF-coils and n detection magnets;

providing a magnetic resonance detection apparatus periodically operatively connectable to each said coil to interrogate the multi-components flow at any one instant;

measuring magnetization and flow velocity of n flowing elements of interest at n positions;

the measured data of flow velocity and magnetization being dependent on the flow rates and composition of flow, whereby individual mass flow rates of individual components may be calculated.

27. A method according to claim 26, wherein the calculated equilibrium magnetizations of the individual components of the flow provides a measure of the mass concentrations of each component of the flow.

28. A method according to claim 26, wherein the product of velocity and equilibrium magnetization of the individual components provides a measure of the instantaneous mass flow rate of each individual component of the flow.

29. A method according to claim 26, wherein the measure of the instantaneous mass flow rates of the individual components of the flow is integrated to provide a measure of the total flow.

30. A method according to claim 26, wherein the method includes the step of generating a multi-exponential gain of magnetization for an element of interest in the magnet arrangement, against the main flow direction, by magnetizing the back flowing multi-component flow until the components of the flow are substantially saturated.

31. A method according to claim 30, wherein the product of velocity and equilibrium magnetization of the individual components provides a measure of the instantaneous mass flow rates of the back flowing individual components of the flow.

32. A method according to claim 31, wherein the measure of the instantaneous mass flow rates of the individual components of the flow is integrated to provide a measure of the back flowing total flow.

* * * * *